(12) United States Patent
Kim

(10) Patent No.: US 8,674,339 B2
(45) Date of Patent: Mar. 18, 2014

(54) LIGHT-EMITTING DEVICES AND METHODS OF MANUFACTURING THE SAME

(75) Inventor: Taek Kim, Seongnam-si (KR)

(73) Assignee: Samsung Electronics Co., Ltd, Gyeonggi-Do (KR)

( * ) Notice: Subject to any disclaimer, the term of this patent is extended or adjusted under 35 U.S.C. 154(b) by 295 days.

(21) Appl. No.: 12/926,419

(22) Filed: Nov. 17, 2010

(65) Prior Publication Data

US 2011/0291069 A1    Dec. 1, 2011

(30) Foreign Application Priority Data

Jun. 1, 2010   (KR) .......................... 10-2010-0051976

(51) Int. Cl.
*H01L 33/06* (2010.01)

(52) U.S. Cl.
USPC ........ 257/13; 257/79; 257/103; 257/E21.089; 257/E33.005

(58) Field of Classification Search
USPC ..................................... 257/13, 79–103, 918, 257/E51.018–E51.022, E33.001–E33.077, 257/E25.028, E25.032
See application file for complete search history.

(56) References Cited

U.S. PATENT DOCUMENTS

| 2004/0129929 | A1 | 7/2004 | Okuyama et al. | |
| 2008/0012030 | A1 | 1/2008 | Yoon et al. | |
| 2008/0157057 | A1* | 7/2008 | Kim | 257/13 |
| 2009/0032800 | A1* | 2/2009 | Lee et al. | 257/13 |

FOREIGN PATENT DOCUMENTS

| JP | 2003-218395 A | 7/2003 |
| KR | 10-0214588 B1 | 8/1999 |
| KR | 10-2004-0029301 A | 4/2004 |
| KR | 10-0646570 B1 | 11/2006 |
| KR | 10-2007-0058612 | 6/2007 |
| KR | 10-0755598 B1 | 9/2007 |
| KR | 10-0755610 B1 | 9/2007 |
| KR | 10-0809235 B1 | 2/2008 |

(Continued)

OTHER PUBLICATIONS

Srinivasan, S. et al., Polychromatic light emission from single InGaN quantum wells grown on pyramidal GaN facets:, Appl. Phys. Lett. 87, 131911 (2005).

(Continued)

*Primary Examiner* — Mamadou Diallo
(74) *Attorney, Agent, or Firm* — Harness, Dickey & Pierce, P.L.C.

(57) ABSTRACT

Light-emitting devices (LED) and methods of manufacturing the same. A LED includes a first type semiconductor layer, a nano array layer that includes a plurality of nano structures each including a first type semiconductor nano core selectively grown from the first type semiconductor layer, and an active layer and a second type semiconductor layer sequentially grown from a side surface of the first type semiconductor nano core, and that is formed in a selective growth region formed in a surface of the first type semiconductor layer, a first electrode layer that is formed to be used when a voltage is applied to the first type semiconductor layer and formed in a predetermined pattern connecting regions that do not correspond to the selective growth region in the first type semiconductor layer, a second electrode layer formed to be used when a voltage is applied to the second type semiconductor layer on the plurality of nano structures, and an insulating layer formed between the first electrode layer and the second electrode layer so that the first electrode layer is insulated from the second electrode layer.

17 Claims, 12 Drawing Sheets

(56) References Cited

FOREIGN PATENT DOCUMENTS

| | | |
|---|---|---|
| KR | 10-0857410 B1 | 9/2008 |
| WO | WO 2006/099211 | 9/2006 |
| WO | WO 2010/014032 | 2/2010 |

OTHER PUBLICATIONS

European Search report dated Aug. 30, 2013 in corresponding Applicaiton No. 11152092.0.

* cited by examiner

LIGHT-EMITTING DEVICES AND METHODS OF MANUFACTURING THE SAME

CROSS-REFERENCE TO RELATED APPLICATION

This application claims priority under 35 U.S.C. §119 to Korean patent application No. 10-2010-0051976, filed on Jun. 1, 2010, in the Korean Intellectual Property Office (KIPO), the entire contents of which is incorporated herein by reference.

BACKGROUND

1. Field

Example embodiments relate to light-emitting devices and methods of manufacturing the same.

2. Description of the Related Art

Semiconductor light-emitting devices (LEDs) are high efficient and environmentally friendly light sources that are widely used in various applications such as display devices, optical communications, vehicles, and/or general lighting. As white-light LED technology has developed, LED technology for general lighting has attracted much attention. A white-light LED may be made by using a blue or ultra violet (UV) LED together with a fluorescent material and/or made by combining red, green, and blue LEDs.

A blue or UV LED, which is a main element of a white-light LED, is generally made using a gallium nitride (GaN)-based compound semiconductor. GaN-based compound semiconductors have a wide band-gap and can obtain light from almost a full wavelength region ranging from visible light to UV, the wavelength depending on the composition of a nitride therein.

Luminance efficiency is an important consideration in designing an LED. The luminance efficiency depends on lattice differences between components constituting the LED and on a difference between thermal expansion coefficients. When an InGaN layer is used as a light-emitting material, an emission spectrum (e.g., color) may be altered by modifying a mole fraction of indium (In) included in the InGaN layer. As the In content is increased, the emission spectrum moves towards longer wavelengths. However, as the In content is increased, a lattice constant is increased, and a lattice mismatch increases between a thin film type InGaN layer and a substrate, lowering the luminance efficiency. As the emission spectrum moves toward a longer wavelength, the luminance efficiency is decreased.

A p-n junction may be formed in the form of a one-dimensional nano structure, such as a nanowire, a nanopillar, and/or a nanocolumn by using a GaN-based compound semiconductor and/or a zinc oxide. Research has been conducted on technology for forming a nanoscale LED. Lattice constant mismatch between a substrate and a one-dimensional nano structure and a difference in thermal expansion coefficients may have less of an impact on luminance efficiency as compared to a thin film type InGaN layer.

SUMMARY

A light-emitting device (LED) with improved luminance efficiency and methods of manufacturing the same may be provided. Additional aspects will be set forth in part in the description which follows and, in part, will be apparent from the description, or may be learned by practice of the example embodiments.

According to an example embodiment, a LED may include a first type semiconductor layer, a nano array layer that includes a plurality of nano structures each including a first type semiconductor nano core selectively grown from the first type semiconductor layer, and an active layer, a second type semiconductor layer sequentially grown from a side surface of the first type semiconductor nano core, that is formed in a selective growth region formed in a surface of the first type semiconductor layer; a first electrode layer that is formed to be used when a voltage is applied to the first type semiconductor layer and formed in a predetermined pattern connecting regions that do not correspond to the selective growth region in the first type semiconductor layer, a second electrode layer formed to be used when a voltage is applied to the second type semiconductor layer on the plurality of nano structures and an insulating layer formed between the first electrode layer and the second electrode layer so that the first electrode layer is insulated from the second electrode layer.

The nano structures may be of a polypyramid shape. The nano array layer may further include a dielectric layer that is formed on a surface of the first type semiconductor layer and include a plurality of nano holes, and the first type semiconductor nano core of each nano structure may be grown from the plurality of nano holes. The active layer of each nano structure may not be connected to an adjacent active layer. The active layer of each nano structure may be connected to an adjacent active layer. The nano array layer may further include a flat structure layer that is formed between adjacent nano structures so as to be parallel to the first type semiconductor layer, and the flat structure layer may include a flat active layer formed so as to connect the active layers of adjacent nano structures, and a flat second type semiconductor layer formed so as to connect the second type semiconductor layers of adjacent nano structures on the flat active layer.

The flat structure layer may be formed between adjacent nano structures. The plurality of nano structures may be classified into a plurality of groups each including two or more nano structures, and the flat structure layer may be formed between the plurality of groups. The first electrode layer may include a plurality of post regions and a wire region for connecting the plurality of post regions.

According to other example embodiments, methods of manufacturing a LED may include forming a first type semiconductor layer, selectively growing a plurality of nano structures each including a first type semiconductor nano core, an active layer, and a second type semiconductor by using a mask for selective growth, forming a first electrode layer in a pattern connecting predetermined regions in which the selective growth does not occur in the first type semiconductor layer; forming an insulating layer so as to surround the first electrode layer, and forming a second electrode layer on the plurality of nano structures.

The growing of the plurality of nano structures may include forming a dielectric layer on the first type semiconductor layer in a pattern in which a plurality of nano holes may be included in regions other than a predetermined region where the selective growth is to be limited, growing the first type semiconductor nano core of each nano structure from the plurality of nano holes, and sequentially growing the active layer and the second type semiconductor layer from a side surface of the first type semiconductor nano core.

According to other example embodiments, a LED may include a first type semiconductor layer, a nano array layer including a plurality of nano structures on a first region of the first type semiconductor layer, each of the plurality of nano structures including a first type semiconductor nano core, an active layer on a surface of the first type semiconductor nano core, and a second type semiconductor layer on the active layer, a first electrode layer configured to apply a first voltage to the first type semiconductor layer, the first electrode layer connecting a plurality of second regions of the first type semiconductor layer, the second regions not including the nano array layer, a second electrode layer configured to apply a second voltage to at least one of the second type semiconductor layers and an insulating layer separating the first electrode layer from the second electrode layer.

According to other example embodiments, methods of manufacturing a LED may include forming a first type semiconductor layer, selectively growing a plurality of nano structures on at least one first region of the first type semiconductor layer using a mask, each of the plurality of nano structures including a first type semiconductor nano core, an active layer, and a second type semiconductor layer, forming a first electrode layer connecting a plurality of second regions of the first type semiconductor layer in which the selective growth does not occur, forming a second electrode layer on the plurality of nano structures and forming an insulating layer to separate the first electrode layer from the second electrode layer.

According to other example embodiments, a LED may include a first semiconductor layer, a first nano structure on the first semiconductor layer, the first nanostructure including a first semiconductor nano core with a first surface, a first active layer on the first surface, and a second semiconductor layer on the first active layer, the first surface not being parallel to the first semiconductor layer.

BRIEF DESCRIPTION OF THE DRAWINGS

Example embodiments will be more clearly understood from the following brief description taken in conjunction with the accompanying drawings. FIGS. 1-11L represent non-limiting, example embodiments as described herein.

FIG. 1 is a schematic cross-sectional diagram illustrating a light-emitting device (LED) according to example embodiments;

FIG. 2 is a partial perspective view of the LED of FIG. 1 including a first electrode layer and an insulating layer according to example embodiments;

FIG. 3 illustrates a nano array layer of the LED of FIG. 1 according to example embodiments;

FIG. 4 is a perspective view illustrating one of a plurality of nano structures that may be included in the LED of FIG. 1 according to example embodiments;

FIG. 5 is a cross-sectional plan view illustrating an arrangement of the plurality of nano structures of the LED of FIG. 1 according to example embodiments;

FIG. 6 is a graph illustrating internal quantum efficiency of the LED of FIG. 1 according to example embodiments;

FIG. 7 is a graph illustrating band-gap variation as a function of the temperature of the LED of FIG. 1 according to example embodiments;

FIGS. 8-10 illustrate nano array layers that may be included in the LED of FIG. 1 according to example embodiments; and FIGS. 11A-11L are diagrams illustrating methods of manufacturing an LED according to example embodiments.

Figure 1:
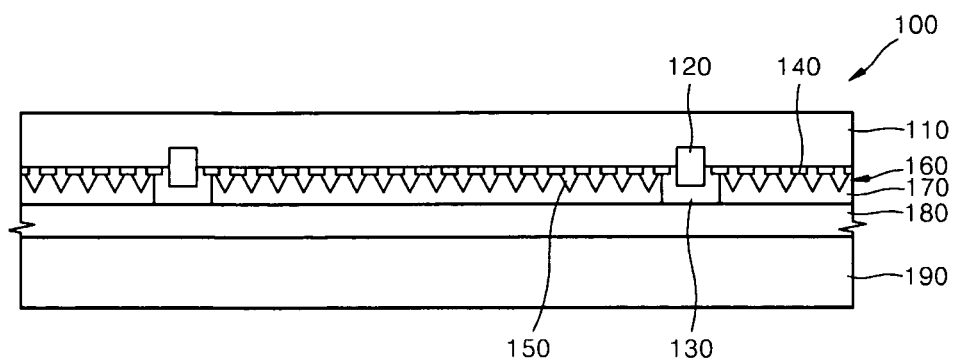

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise.

It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
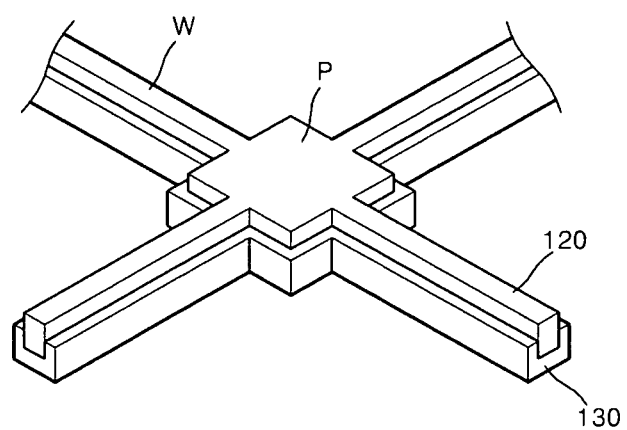
Figure 3:
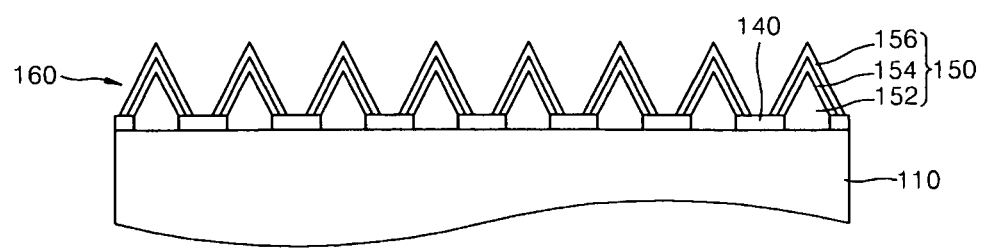
Figure 4:
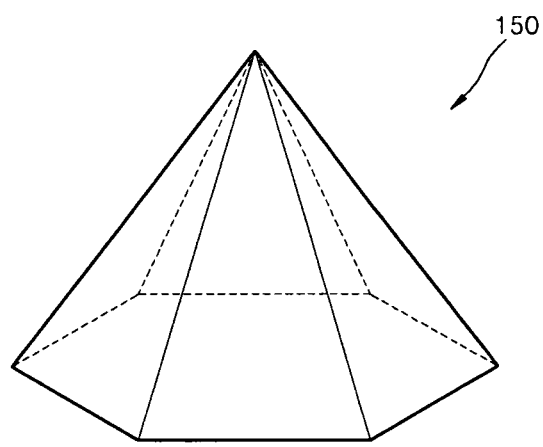
Figure 5:
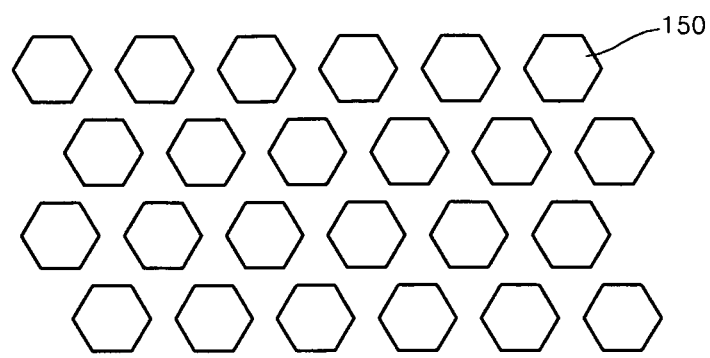

FIG. 1 is a schematic cross-sectional diagram illustrating a light-emitting device (LED) 100 according to example embodiments. FIG. 2 is a partial perspective view of the LED 100 of FIG. 1 including a first electrode layer 120 and an insulating layer 130. FIG. 3 illustrates a nano array layer 160 of the LED 100 of FIG. 1. FIG. 4 is a perspective view illustrating one of a plurality of nano structures 150 that may be included in the LED 100 of FIG. 1. FIG. 5 is a cross-sectional plan view illustrating an arrangement of the plurality of nano structures 150 of the LED 100 of FIG. 1.

Referring to FIG. 1, the LED 100 may include a first type semiconductor layer 110, a nano array layer 160, a first electrode layer 120, a second electrode layer 170, an insulating layer 130, a bonding metal layer 180 and a conductive template 190. The nano array layer 160 may be in a selective growth region in a surface of the first type semiconductor layer 110 and may include a plurality of nano structures 150. The first electrode layer 120 may be on the first type semiconductor layer 110 in a pattern so as to connect regions that do not correspond to the selective growth region. The second electrode layer 170 may be on the nano structures 150. The insulating layer 130 may be on the first electrode layer 120 so as to insulate the first electrode layer 120 from the second electrode layer 170. A bonding metal layer 180 and a conductive template 190 may be stacked on a surface of the second electrode layer 170.

The first type semiconductor layer 110 may be doped with a first type semiconductor and may be of, for example, an n-GaN material. The nano array layer 160 may include the plurality of nano structures 150 (see FIG. 3). The nano array layer 160 may include the dielectric layer 140 patterned so as to include a plurality of nano holes, the nano structures 150 in the plurality of nano holes. Each nano structure 150 may include a first type semiconductor nano core 152 on the first type semiconductor layer 110 in the nano holes, an active layer 154, and a second type semiconductor layer 156. The active layer 154 and the second type semiconductor layer 156 may be stacked on a side surface of the first type semiconductor nano core 152. In FIG. 3, the active layer 154 of one nano structure 150 is not connected to the active layer 154 of an adjacent nano structure 150, but the present invention is not limited thereto.

Each nano structure 150 may have, for example, a polypyramid shape, and/or may have a hexagonal pyramid shape as illustrated in FIG. 4. A diameter of a cross-section of each nano structure 150 may be less than about 1 μm. Each nano structure 150 may have a heterojunction structure using a group III-V material. For example, GaN/InGaN, ZnO/MgZnO, GaAs/InGaAs, InP, InAs, AlGaInP, and/or AlGaInAs in a p-i-n structure. For example, when each nano structure 150 is a GaN-based semiconductor material, the first type semiconductor nano core 152 may be formed of n-GaN, and the second type semiconductor layer 156 may be formed of p-GaN. The active layer 154 may be a GaN/InGaN-based single- or multi-quantum well structure. The first semiconductor nano core 152 may be, for example, n-$Al_xGa_yIn_zN$ (x+y+z=1). The second type semiconductor layer 156 may be, for example, p-$Al_xGa_yIn_zN$ (x+y+z=1). The active layer 154 may be a single- or multi-quantum well structure in which an interval of a band is controlled by periodically changing values of x, y, and z in, for example, $Al_xGa_yIn_zN$. An emission wavelength may vary depending on a mole fraction of In of the InGaN material of the active layer 154. For example, as the In content is increased, a color of light emitted by the LED 100 may move toward a longer wavelength band.

The nano structures 150 may each be of a structure capable of increasing an internal quantum efficiency compared to an emission structure based on a conventional thin film technology. When a first type semiconductor nano core 152 is grown by using the dielectric layer 140 including the plurality of nano holes on a first type semiconductor layer 110 grown in a [0001] direction, a side surface of the grown first type semiconductor nano core 152 may become a (11-11) or (11-22) surface which is a semipolar surface. When the active layer 154 of a quantum well structure is grown on a semipolar surface, spontaneous polarization may be reduced. Because the size of the formed structure is nanoscale, strain may be relieved and polarization due to a piezoelectric field effect may be suppressed, thereby suppressing a quantum confinement stark effect (QCSE) occurring with a non-polar surface. Occurrences of crystal defects may be reduced when the In content of the active layer 154 is increased and it may be relatively easy to maintain a constant In content. A light extraction effect may be increased.

The first electrode layer 120 may be used when a voltage is applied to the first type semiconductor layer 110. The first electrode layer 120 may be directly on the first type semiconductor layer 110 and may be of a pattern that connects regions that do not correspond to the selective growth region formed in a surface of the first type semiconductor layer 110. The first electrode layer 120 may include a plurality of post regions P and a wire region W for connecting the plurality of post regions P. As illustrated in FIG. 2, each post region P may be relatively wide, and the wire region W may be relatively narrow. Any one of the plurality of post regions P may be exposed by, for example, etching a part of the first type semiconductor layer 110. A bonding pad to be connected to an external power supply unit may be attached to the exposed post region P so as to be used when a voltage is applied to the first type semiconductor layer 110.

The first electrode layer 120 may allow current to effectively spread when a voltage is applied to the first type semiconductor layer 110. When the first electrode layer 120 is only in a specific location current crowding may occur and it may be difficult for current to effectively spread. According to example embodiments, because the first electrode layer 120 may be of a structure capable of relatively uniformly applying current to various locations of the first type semiconductor layer 110 on which the nano structures 150 are located, carriers may be more effectively supplied to each of the plurality of nano structures 150.

Figure 6:
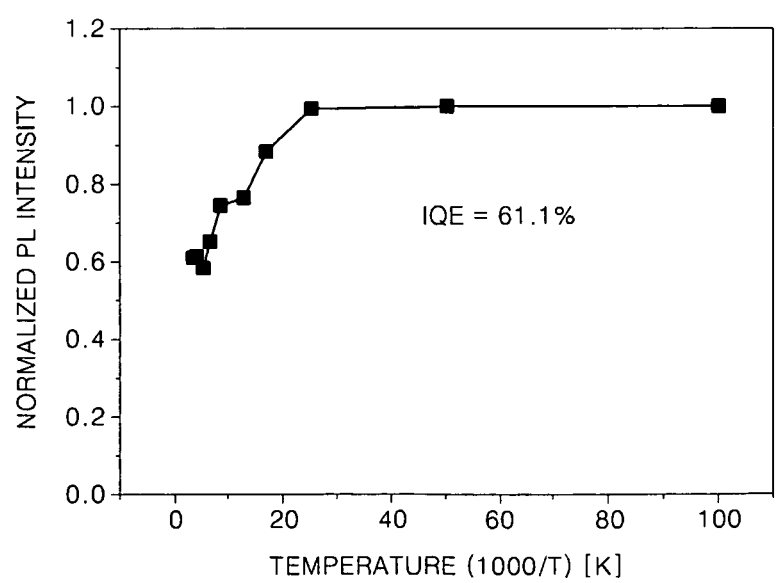

FIG. 6 is a graph illustrating internal quantum efficiency of an LED 100. An active layer 154 may be a composition including an InGaN compound. Light emitted may have a center wavelength of 570 nm. In spite of a long wavelength band, the internal quantum efficiency may be 61%, which is an improved value compared to a general internal quantum efficiency of less than 10% in the same wavelength band.

Figure 7:
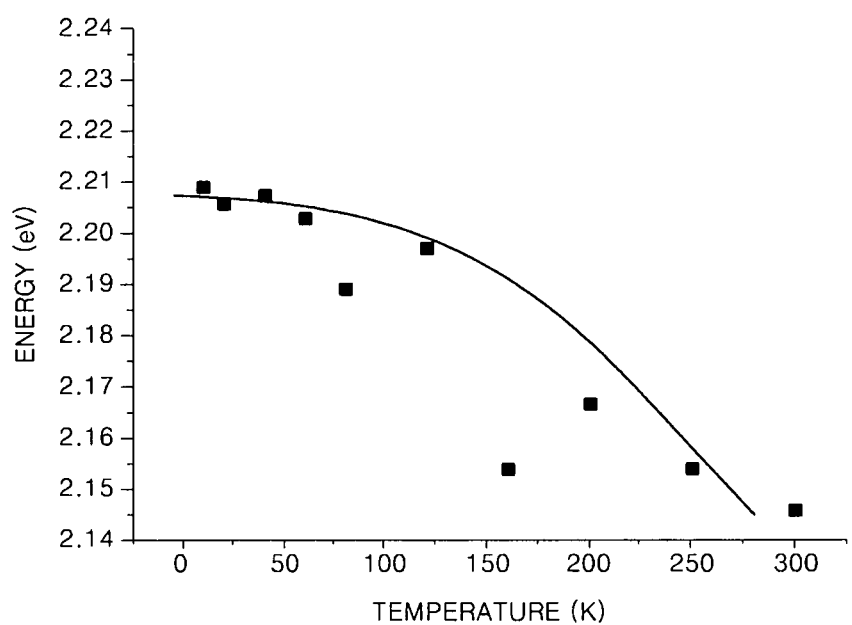

FIG. 7 is a graph illustrating band-gap variation with respect to the temperature of the LED 100 according to example embodiments. In general, the wavelength of light emitted by an LED having an InGaN compound shows an S-shaped plot. As the temperature of the LED is increased, the wavelength of light emitted is sequentially decreased, increased, and decreased due to nonuniformity of the In content. The S-shaped wavelength variation may correspond to In fluctuation. In this case, the total band-gap variation may be in the range of about 20 to about 30 meV. Referring to the graph of FIG. 7, the band-gap variation does not have an S-shaped plot, and generally decreases as the temperature of the LED 100 increases. The band-gap variation may be about 63 meV. This graph may be a result of the LED 100 emitting a long wavelength of light and being of a relatively uniform distribution of In. According to example embodiments variations in emission wavelength according to light pumping power may be observed. However, although power of a pump laser may be increased at a normal temperature, the wavelength is hardly changed. This may show that strain of an InGaN layer is relieved by the shape and nano-size of the nano structures 150.

Figure 8:
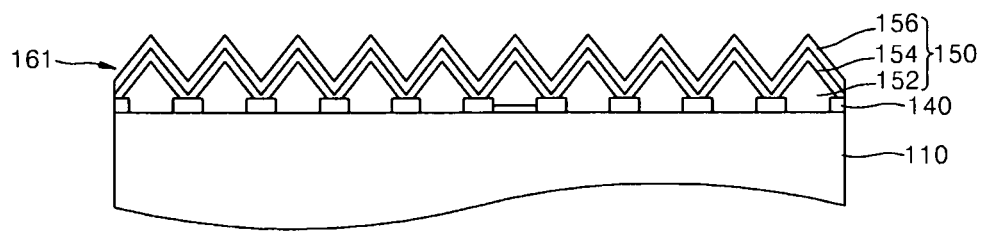

FIG. 8 illustrates a nano array layer 161 of an LED 100 of FIG. 1 according to another example embodiment. The nano array layer 161 may be different from the nano array layer 160 of FIG. 1 in that the active layer 154 of one nano structure 150 of FIG. 8 may be connected to the active layer 154 of an adjacent nano structure 150. This structure may further reduce a leakage current.

Figure 9:
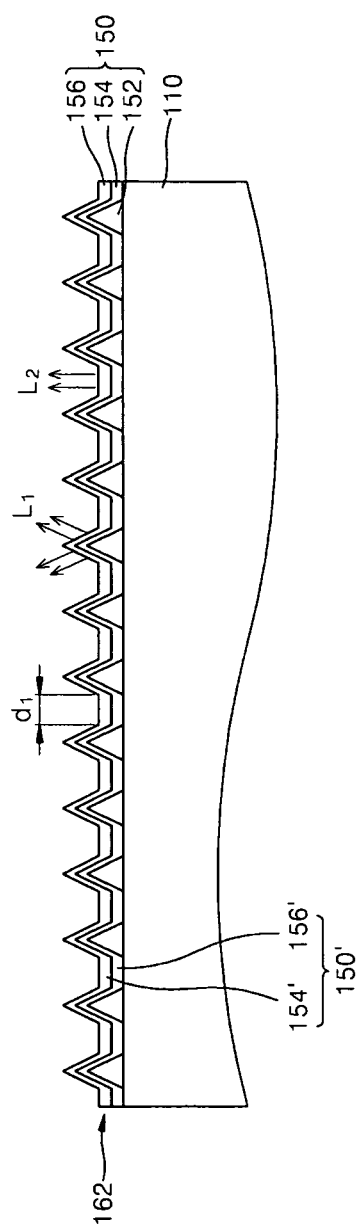
Figure 10:
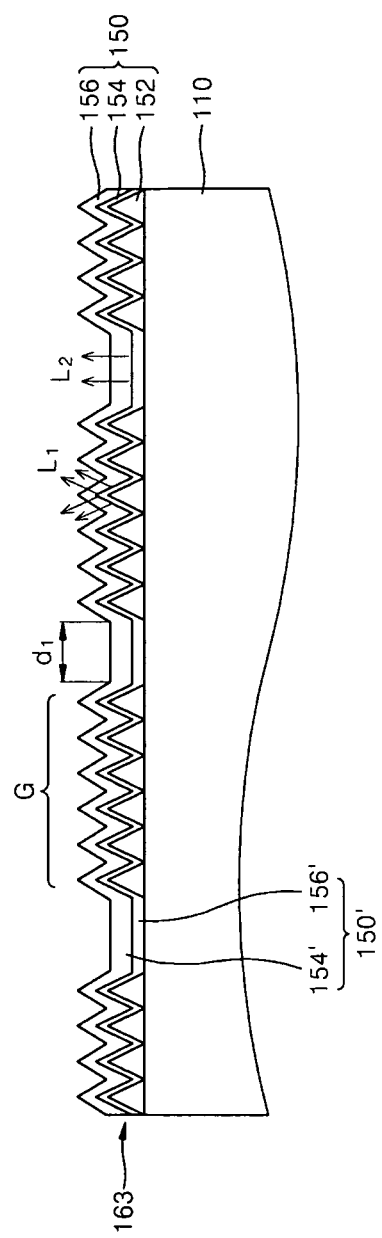

FIGS. 9 and 10 respectively illustrate nano array layers 162 and 163 that may be included in the LED 100 of FIG. 1 according to other example embodiments of the present invention. The above-described nano array layers 160 and 161 may emit short wavelength light by controlling the In content of the active layer 154, while the nano array layers 162 and 163 according to example embodiments may have structures capable of emitting white light. Referring to FIG. 9, the dielectric layer 140 may not be included in the nano array layer 162. The active layer 154 and the second type semiconductor layer 156 may be stacked on side surfaces of the first type semiconductor nano core 152. A flat structure layer 150' may be between adjacent nano structures 150. The flat structure layer 150' may include a flat active layer 154' connecting the active layers 154 of adjacent nano structures 150. A flat second type semiconductor layer 156' may connect the second type semiconductor layers 156 of adjacent nano structures 150 on the flat active layer 154'. The flat active layer 154' may be on a c-plane, and the active layer 154 may be on a semipolar surface. The content of InGaN may be different between the flat active layer 154' and the active layer 154 (e.g., even where fabricated during the same process). A relatively long wavelength light L1 may be emitted through the nano structures 150 and a relatively short wavelength light L2 may be emitted through the flat structure layer 150'. The amount of the short wavelength light L2 may be controlled by controlling a length dl of the flat structure layer 150'. White light may be emitted by the nano array layer 162.

The nano array layer 163 of FIG. 10 may be different from that of FIG. 9 in that the flat structure layer 150' may be between groups G each including two or more nano structures 150 instead of being formed between each adjacent nano structure 150. When the long wavelength light L1 emitted from the nano structures 150 and the short wavelength light L2 emitted from the flat structure layer 150' are combined, white light may be displayed. The number of the nano structures 150 constituting each group G and the length of the flat structure layer 150' may be determined so as to display white light in consideration of, for example, wavelength values of the long wavelength light L1 and the short wavelength light L2.

Figure 11A:
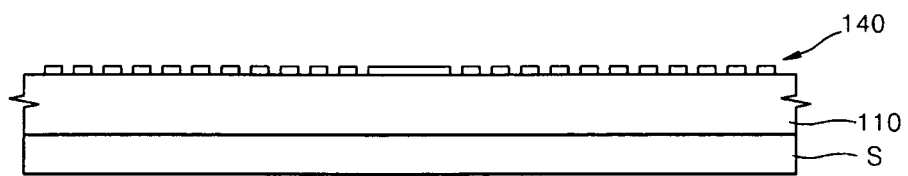

FIGS. 11A-11I are diagrams illustrating methods of manufacturing an LED according to example embodiments of the present invention. Referring to FIG. 11A, a first type semiconductor layer 110 and a dielectric layer 140 may be sequentially formed on a substrate S. The substrate S may be a sapphire substrate, a silicon carbide (SiC) substrate, and/or a GaN substrate. The first type semiconductor layer 110 may be formed of, for example, an n-GaN material. The dielectric layer 140 may be formed on a surface of the first type semiconductor layer 110 and patterned to form a selective growth region and a growth limit region. The dielectric layer 140 may be patterned to include a plurality of nano holes. The nano holes may not be formed in a region in which a selective growth is to be limited. A cross-section of each nano hole may have various shapes (e.g., a circular shape and/or a polygonal shape) but the present invention is not limited thereto. The cross-section of each nano hole may have, for example, a hexagonal shape.

Figure 11B:
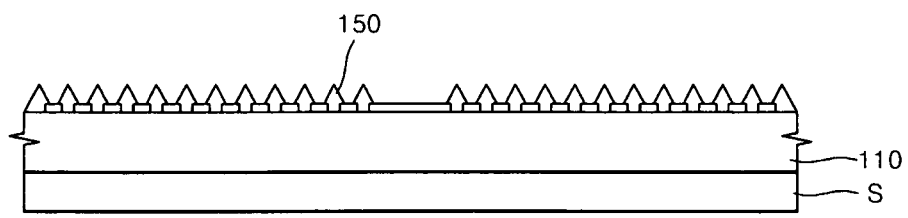

Referring to FIG. 11B, a nano array layer may be formed by growing nano structures 150 from each of the plurality of nano holes. The nano structures 150 may be formed on the selective growth region on which the nano holes are formed, and may not be formed in a region in which the nano holes are not formed. The region in which the nano holes are not formed may include a region where a first electrode layer is formed. After the first type semiconductor nano core 152 is selectively grown, the active layer 154 and the second type semiconductor layer 156 may be sequentially grown from one or more side surfaces of the first type semiconductor nano core 152. The nano structures 150 may be of, for example, a polypyramid shape (e.g., a hexagonal pyramid). A diameter of a cross-section of each nano structure 150 may be less than about 1 μm. The active layers 154 of adjacent nano structures 150 may be connected to each other. When an emission color desired to be displayed is white, the nano array layer may be formed, for example, as illustrated in FIGS. 9 and 10. In this case, after the first type semiconductor nano core 152 is grown, the dielectric layer 140 for forming the nano holes may be removed. The active layer 154 and the second type semiconductor layer 156 may be formed.

Figure 11C:
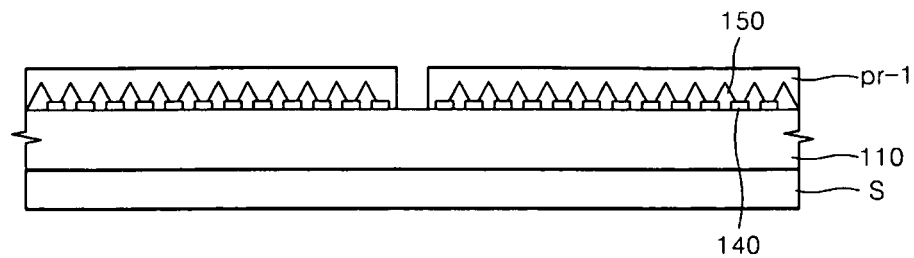
Figure 11D:
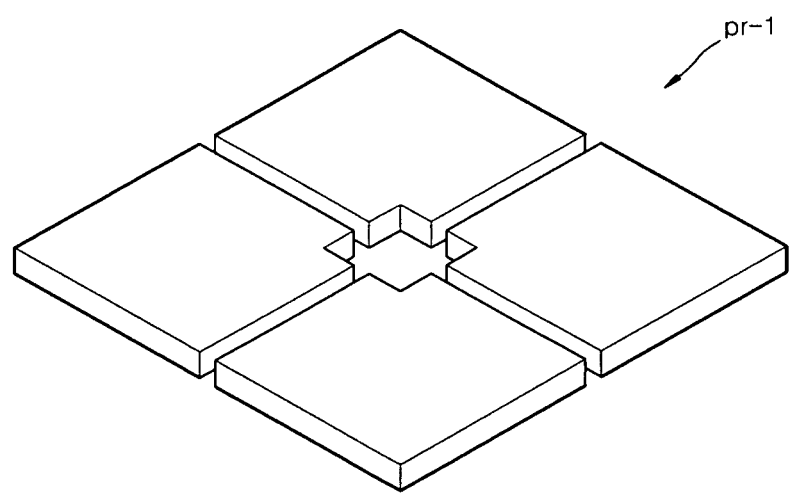
Figure 11E:
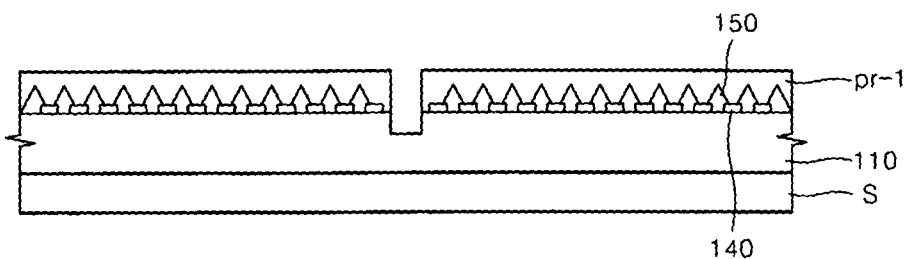

Referring to FIGS. 11C-11E, a photoresist layer pr-1 may be formed in a pattern and the dielectric layer 140 corresponding to a region to which a selective growth of the nano structure 150 is limited may be removed. A surface of the first type semiconductor layer 110 may be partially exposed. The patterned photoresist layer pr-1 may have an inverse shape of a first electrode layer to be formed. The first type semiconductor layer 110 may be etched by using the photoresist layer pr-1 patterned as illustrated in FIG. 11E as a mask, but this process may be omitted. The etching depth may be properly controlled.

Figure 11F:
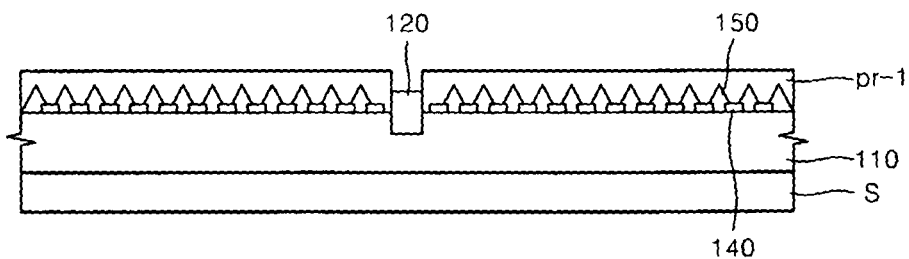

Referring of FIG. 11F, a conductive material may be deposited on the exposed first type semiconductor layer 110 to form a first electrode layer 120. The first electrode layer 120 may be of a shape including the plurality of post regions P of which a width is relatively wide and the wire region W connecting the post regions P. The first electrode layer 120 may be connected to an external power supplying unit so that carriers may be injected into the nano structures 150. The first electrode layer 120 may be formed of, for example, a metal (e.g., Au, Al, and/or Ag) and/or a transparent conductive material (e.g., indium tin oxide (ITO)). The material for forming the first electrode layer 120 may be determined according to a direction in which light emitted in the nano structure 150 is to be extracted. For example, when light from the nano structure 150 is extracted toward the first type semiconductor layer 110, the first electrode layer 120 may be formed of a reflective metal material.

Figure 11G:
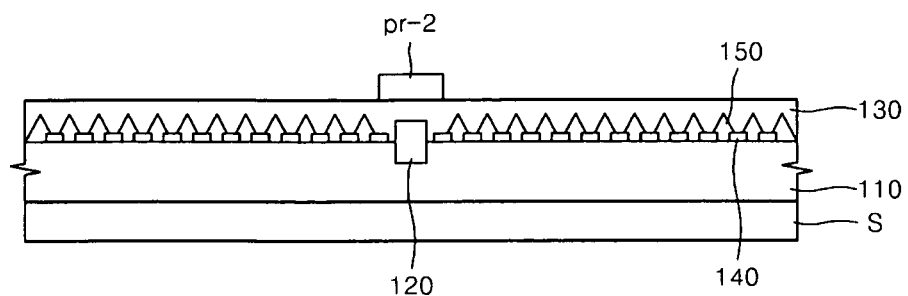
Figure 11H:
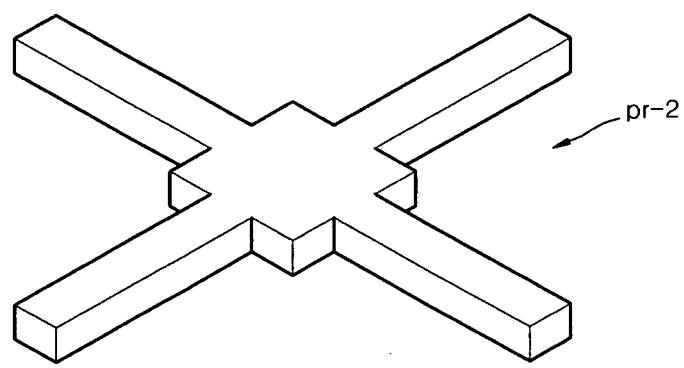
Figure 11I:
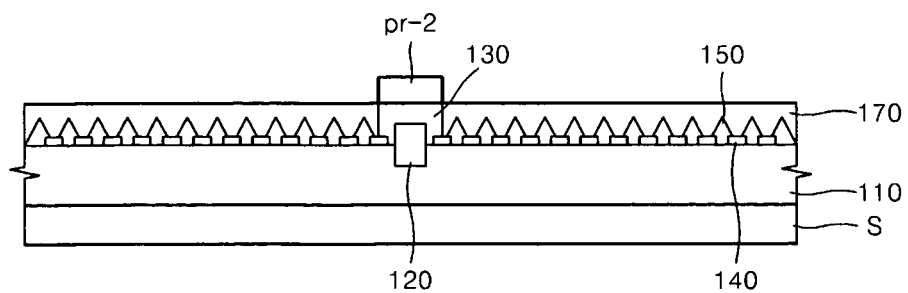

Referring to FIGS. 11G and 11H, the photoresist layer pr-1 may be removed. An insulating material may be deposited on the entire structure to form an insulating layer 130. A photoresist layer pr-2 may be formed in a pattern on the insulating layer 130 as illustrated in FIG. 11G. The photoresist layer pr-2 may be formed so that an insulating material covering the nano structures 150 may be removed while the insulating material for forming the insulating layer 130 may remain. The photoresist layer pr-2 may be formed in a pattern, for example, as illustrated in FIG. 11H.

Figure 11J:
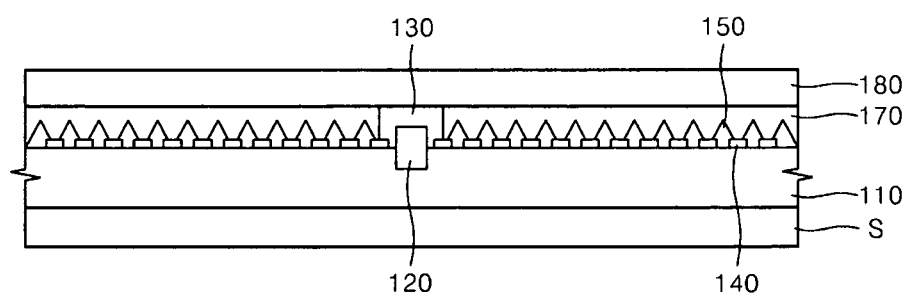
Figure 11K:
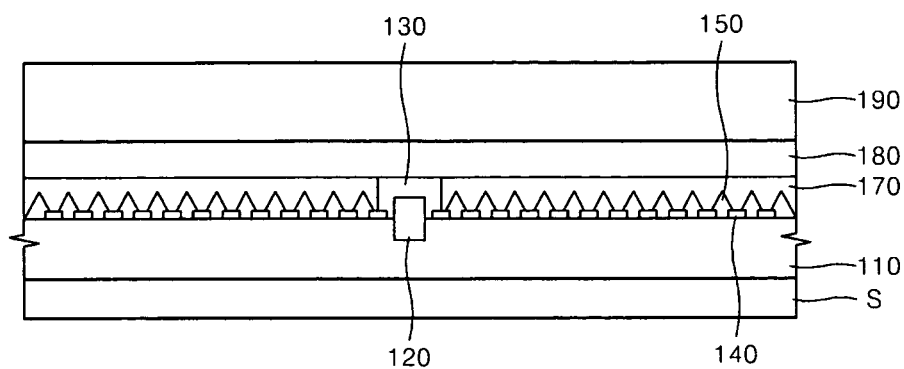
Figure 11L:
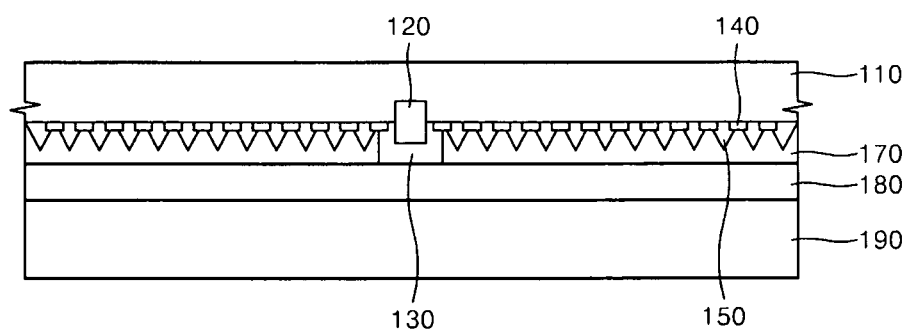

Referring to FIGS. 11I-11L, the insulating layer 130 may be partially etched by using the photoresist layer pr-2 as a mask. A conductive material may be deposited on the exposed nano structure 150 to form a second electrode layer 170. A voltage may be applied to the second electrode layer 170 and the first electrode layer 120 in order to inject carriers into the nano structure 150 (not shown). The second electrode layer 170 may be formed of a metal (e.g., Au, Al, or Ag) and/or a transparent conductive material (e.g., ITO). Referring to FIG. 11J, a bonding metal layer 180 and a conductive template 190 may be sequentially formed on the second electrode layer 170. The substrate S may be removed from the first type semiconductor layer 110 by, for example, using a laser lift-off method. An LED may be formed as illustrated in FIG. 11L.

According to the above-described LEDs and methods of manufacturing the same, a region where a nano structure is not selectively grown may be formed in a first type semiconductor layer, an electrode structure may be directly formed in the region, thereby forming an LED having reduced current crowding and capable of effectively spreading current through the nano structure. In addition, the shape and size of the nano structure may be properly selected, thereby forming the LED having an improved luminance efficiency in a long wavelength band, for example, a green or yellow wavelength band.

While example embodiments have been particularly shown and described, it will be understood by one of ordinary skill in the art that variations in form and detail may be made therein without departing from the spirit and scope of the claims.

What is claimed is:

1. A light-emitting device (LED), comprising:
a first type semiconductor layer;
a nano array layer including a plurality of nano structures on a first region of the first type semiconductor layer, each of the plurality of nano structures including a first type semiconductor nano core, an active layer on a surface of the first type semiconductor nano core, and a second type semiconductor layer on the active layer;
a first electrode layer configured to apply a first voltage to the first type semiconductor layer, the first electrode layer connecting a plurality of second regions of the first type semiconductor layer, the second regions not including the nano array layer;
a second electrode layer configured to apply a second voltage to at least one of the second type semiconductor layers; and
an insulating layer separating the first electrode layer from the second electrode layer.

2. The LED of claim 1, wherein at least one of the plurality of nano structures is polypyramid shaped.

3. The LED of claim 2, wherein the nano array layer further includes a dielectric layer on the first region between the first type semiconductor nano cores.

4. The LED of claim 3, wherein the active layer of at least one of the plurality of nano structures is separated from the active layer of an adjacent one of the plurality of nano structures.

5. The LED of claim 3, wherein the active layer of at least one of the plurality of nano structures is in contact with the active layer of an adjacent one of the plurality of nano structures.

6. The LED of claim 2, wherein the nano array layer further includes at least one flat structure layer between at least two of the plurality of nano structures,
the at least one flat structure layer is about parallel to the first type semiconductor layer, and includes at least one flat active layer and at least one flat second type semiconductor layer,
the at least one flat active layer connects the active layers of the at least two of the plurality of nano structures, and
the at least one flat second type semiconductor layer connects the second type semiconductor layers of the at least two of the plurality of nano structures.

7. The LED of claim 2, wherein the nano array layer further includes a flat structure layer between the plurality of nano structures.

8. The LED of claim 2, wherein the plurality of nano structures is a plurality of groups of nanostructures, each of the plurality of groups including two or more nano structures,
the nano array layer further includes at least one flat structure layer connecting the plurality of groups, the at least one flat structure layer including at least one flat active layer and at least one flat second type semiconductor layer, and
the flat structure layer is not between the nanostructures of any group of the plurality of groups.

9. The LED of claim 3, wherein the first electrode layer includes a plurality of post regions and at least one wire region connecting the plurality of post regions.

10. A method of manufacturing a light-emitting device (LED), the method comprising:
forming a first type semiconductor layer;
selectively growing a plurality of nano structures on at least one first region of the first type semiconductor layer using a mask, each of the plurality of nano structures including a first type semiconductor nano core, an active layer, and a second type semiconductor layer;

forming a first electrode layer connecting a plurality of second regions of the first type semiconductor layer in which the selective growth does not occur;

forming a second electrode layer on the plurality of nano structures; and forming an insulating layer to separate the first electrode layer from the second electrode layer.

11. The method of claim 10, wherein the selectively growing the plurality of nano structures includes:

forming a dielectric layer to include a plurality of nano holes, the plurality of nano holes on the at least one first region;

growing the first type semiconductor nano cores of the plurality of nano structures from the plurality of nano holes; and sequentially growing the active layers and the second type semiconductor layers of the plurality of nano structures on corresponding surfaces of the first type semiconductor nano cores.

12. The method of claim 11, wherein the growing of the first type semiconductor nano cores includes growing the nano cores to be polypyramid shaped.

13. The method of claim 11, wherein the forming of the first electrode layer includes forming a pattern including a plurality of post regions and at least one wire region connecting the post regions.

14. The method of claim 11, wherein the selectively growing the plurality of nano structures further includes:

removing a portion of the dielectric layer including the plurality of nano holes from the first region after the growing of the first type semiconductor nano cores and prior to the growing of the active layers.

15. The method of claim 11, wherein the active layers of the plurality of nano structures are separated from each other.

16. The method of claim 11, wherein the active layers of the plurality of nano structures are in contact with each other.

17. The method of claim 11, wherein the forming of the first electrode layer includes:

partially exposing the first type semiconductor layer by removing a portion of the dielectric layer; and depositing a conductive material onto the exposed first type semiconductor layer.

\* \* \* \* \*